(12) United States Patent
Shukla et al.

(10) Patent No.: US 11,195,689 B2
(45) Date of Patent: Dec. 7, 2021

(54) SAMPLE HOLDER FOR ELECTRON MICROSCOPY

(71) Applicant: ZoNexus LLC, Pinole, CA (US)

(72) Inventors: Alpesh Khushalchand Shukla, Pinole, CA (US); John Fischer, Santa Clara, CA (US); Alexander Park, Albany, CA (US)

(73) Assignee: ZoNexus LLC, Pinole, CA (US)

( * ) Notice: Subject to any disclaimer, the term of this patent is extended or adjusted under 35 U.S.C. 154(b) by 0 days.

(21) Appl. No.: 16/944,979

(22) Filed: Jul. 31, 2020

(65) Prior Publication Data

US 2021/0035771 A1    Feb. 4, 2021

Related U.S. Application Data

(60) Provisional application No. 62/882,496, filed on Aug. 3, 2019.

(51) Int. Cl.
*H01J 37/20*    (2006.01)
*H01J 37/28*    (2006.01)

(52) U.S. Cl.
CPC .............. *H01J 37/20* (2013.01); *H01J 37/28* (2013.01); *H01J 2237/20235* (2013.01)

(58) Field of Classification Search
CPC .......... H01J 37/00; H01J 37/02; H01J 37/023; H01J 37/16; H01J 37/26; H01J 37/20; H01J 37/28; H01J 2237/20235; H01J 2237/2005; H01J 2237/204

USPC .............................. 250/306, 307, 311, 491.1
See application file for complete search history.

(56) References Cited

U.S. PATENT DOCUMENTS

| | | | | |
|---|---|---|---|---|
| 5,752,796 | A | * | 5/1998 | Muka ................ H01L 21/67017 414/217.1 |
| 2011/0114591 | A1 | * | 5/2011 | Giraud ............... B65D 43/0202 215/224 |
| 2012/0112062 | A1 | * | 5/2012 | Novak ................. H01J 37/244 250/307 |
| 2018/0277335 | A1 | * | 9/2018 | Iwaya ................... H01J 37/261 |

* cited by examiner

*Primary Examiner* — Jason L McCormack
(74) *Attorney, Agent, or Firm* — Intellent Patents LLC; Ahmed Alhafidh

(57) ABSTRACT

A sample holder for electron microscopy of air-sensitive samples for use in electron microscopy incorporates a housing and a closure assembly. The closure assembly comprises a lid comprising at least one closure arm receiving portions recessed within a flat, planar upper surface thereof. The housing comprises one or more closure arm(s) corresponding to one or more closure arm receiving portion(s). In a fully closed position, the closure arm(s) share contact with the closure arm receiving portion(s). The lid is flexibly coupled to a motor cover plate which can be actuated by a motor assembly configured to open and close the lid. The sample holder also includes an elevator assembly with a vertically adjustable sample stage which sits below the lid. The sample stage is vertically adjusted by actuation of a bellows assembly which sits beneath the sample stage.

1 Claim, 9 Drawing Sheets

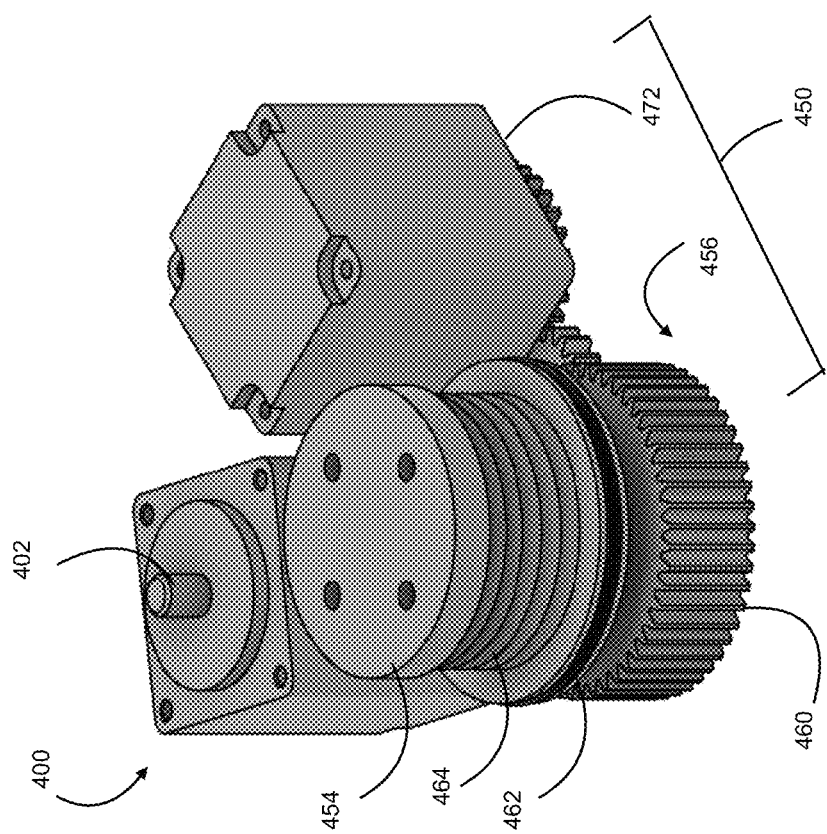

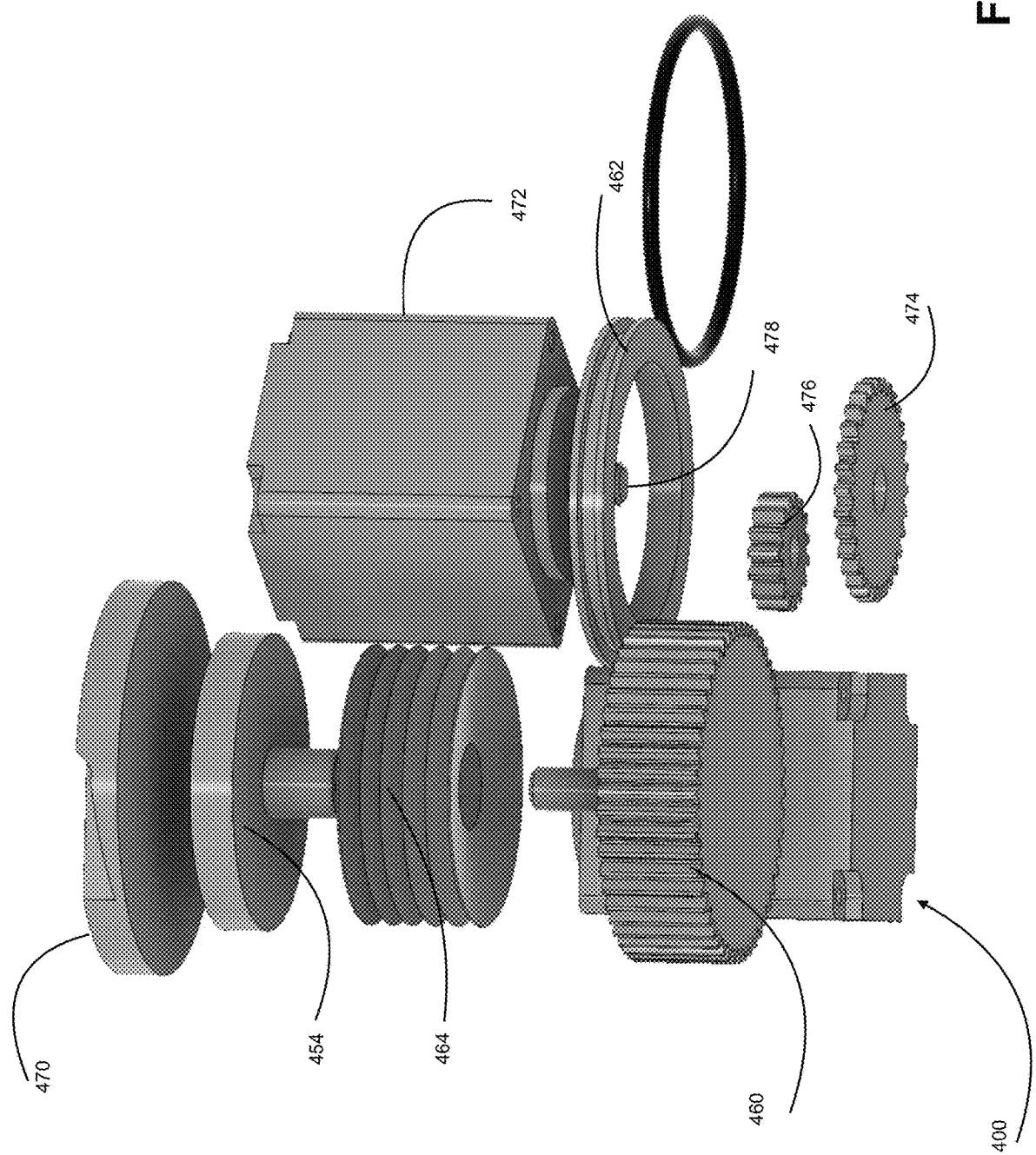

SAMPLE HOLDER FOR ELECTRON MICROSCOPY

CLAIM OF PRIORITY

This application claims priority to U.S. Provisional Patent Application No. 62/882,496 filed Aug. 3, 2019, the entire disclosure of which is expressly incorporated by reference.

FIELD OF TECHNOLOGY

The present description relates generally to sample holders for performing in-situ experiments using electron microscopy, in particular focused ion beam scanning electron microscopy (FIB-SEM).

BACKGROUND/SUMMARY

Scanning Electron Microscopy (SEM) is a high-resolution imaging technique that produces images by rastering the surface of a material with an electron probe. When combined with a spectroscopy technique such an X-ray energy dispersive spectroscopy, it is also used to obtain chemical information. Focused ion beam (FIB) is a technique used for fabrication of materials at a nanoscale which may be used for other high-resolution imaging procedures such as Transmission Electron Microscopy (TEM). Although focused ion beam can also be used for imaging, it is often combined with an SEM column in the same instrument, hereafter referred as FIB-SEM. FIB-SEM may be used for analysis and/or processing of air-sensitive samples, such as lithium or sodium metal, or materials used for lithium ion and sodium ion batteries. In order to prepare air-sensitive samples for use in conjunction with SEM or FIB-SEM systems, it is necessary to prepare the air-sensitive samples in an air-free environment such as a glove box filled with inert gas and transfer the prepared samples to the microscope for analysis. Furthermore, it is necessary to transport a sample prepared using FIB-SEM (for example for analysis using TEM or X-ray based techniques) to an inert atmosphere without exposure to air.

One example approach for preparing and transferring air-sensitive samples includes utilizing a sample holder that includes a sample stage for loading the sample and a lid that includes a plurality of fasteners for securing and sealing the lid on to the holder after mounting the sample in an air-free atmosphere. The fasteners are also used for maintaining the sealing during transport and until the sample holder is enclosed within a vacuum-environment of the microscope.

However, the inventor herein has identified potential issues with such an approach. For example, the plurality of fasteners that secure the lid include one or more of screws and knobs for turning the screws. These fasteners protrude outward from the top surface of the sample holder lid, and when placed within the microscope interfere with the one or more components on the inside of the microscope, and thus restrict the level of resolution and complexity of nanofabrication that can be realized with high-resolution imaging systems. For example, the fasteners on the lid may interfere with a tilt mechanism of a FIB-SEM microscope and restrict an amount of tilt of the microscope stage. Further, in a dual beam FIB-SEM, in order to make lamella for TEM or 3D imaging using serial sectioning, it is important to achieve high degree of tilt, which is greatly restricted by fasteners on top of the lid of the sample holder. Thus, in order to use the sample holder with protruding fasteners, the FIB-SEM system may need extensive modification, which is time consuming and not cost effective.

Some of the above-mentioned issues may be addressed by a sample holder for focused ion beam scanning electron microscopy, comprising: a housing; a closure assembly coupled to the housing; wherein the closure assembly includes a lid; wherein the lid includes one or more closure arm receiving portions; and wherein an upper surface of the lid is a planar flat surface with the or more closure arm receiving portions are recessed from the upper surface. In this way, by configuring the lid with a flat planar surface without any fasteners or elements protruding outward, interference of the lid with a high-resolution microcopy and fabricating system, such as FIB-SEM, is reduced.

As an example, each closure arm receiving portion on the lid may include a ramp and a groove. Furthermore, each closure arum may include a diagonal surface complimentary to the corresponding ramp, and a downward convex surface complimentary to the groove. When the lid is in a fully closed position the complimentary surfaces are in face sharing contact with each other. The immovable closure arm exerts a downward pressure on to the lid and this down pressure secures and seals the lid onto the sample holder, and maintains the sealing during transport. Further, the sample holder housing may include an elevator mechanism for moving the stage in a positive and negative z-direction within the microscope, which increases fine control and resolution, particularly for applications such as 3D imaging with serial sectioning.

In this way, the air-free sample holder for electron microscopy, by providing a lid with a sealing mechanism that allows the lid to be configured as a planar top surface and without protrusions on the top surface, and by providing an in-built Z-height adjustment for the sample holder, greatly reduces interference of the sample holder lid with the complex microscopy components. As a result, more complex functions of the FIB-SEM system can be realized with reduced costs.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 4A shows a top perspective view of a first motor assembly and an elevator assembly that is enclosed within a housing of a sample holder, such as sample holder of FIG. 1.

FIG. 5 shows an exploded view of the first motor assembly and the elevator assembly of FIG. 4A.

DETAILED DESCRIPTION

Figure 6:
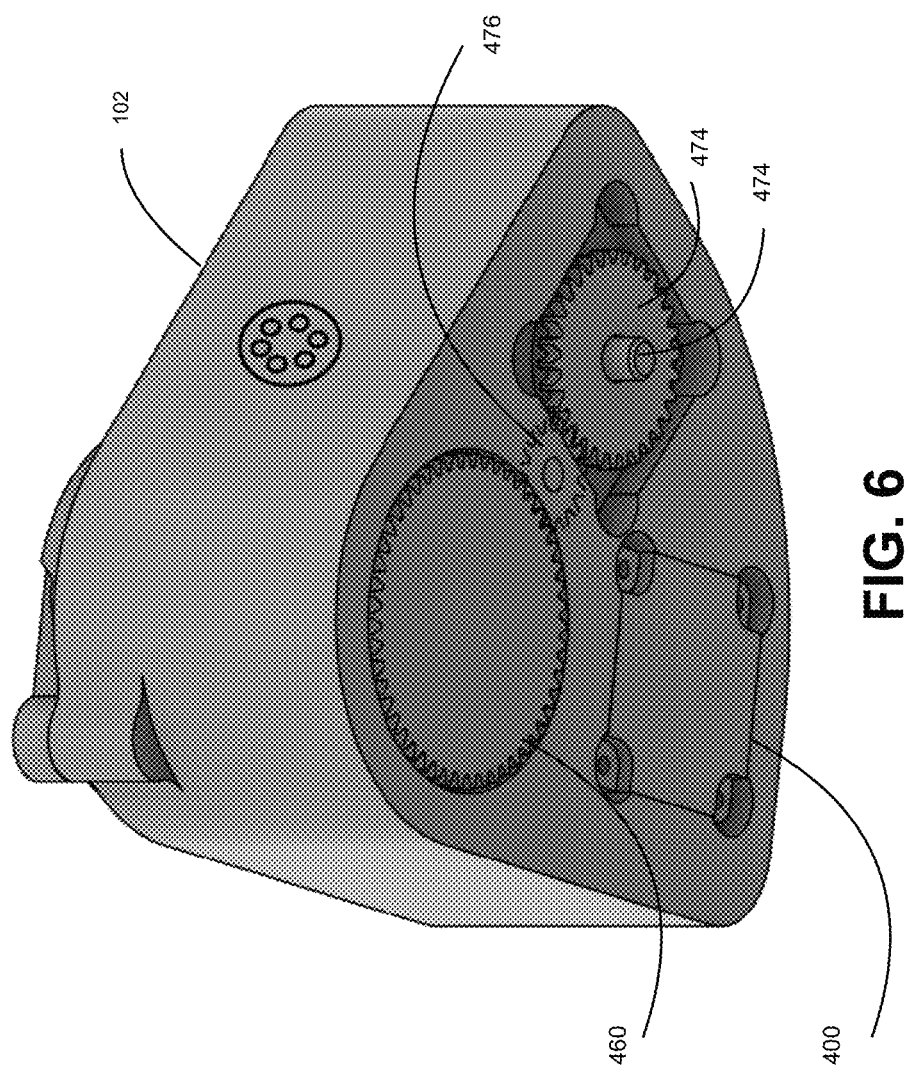
FIG. 6 shows a bottom perspective view of the sample holder with a bottom plate removed.
Figure 7:
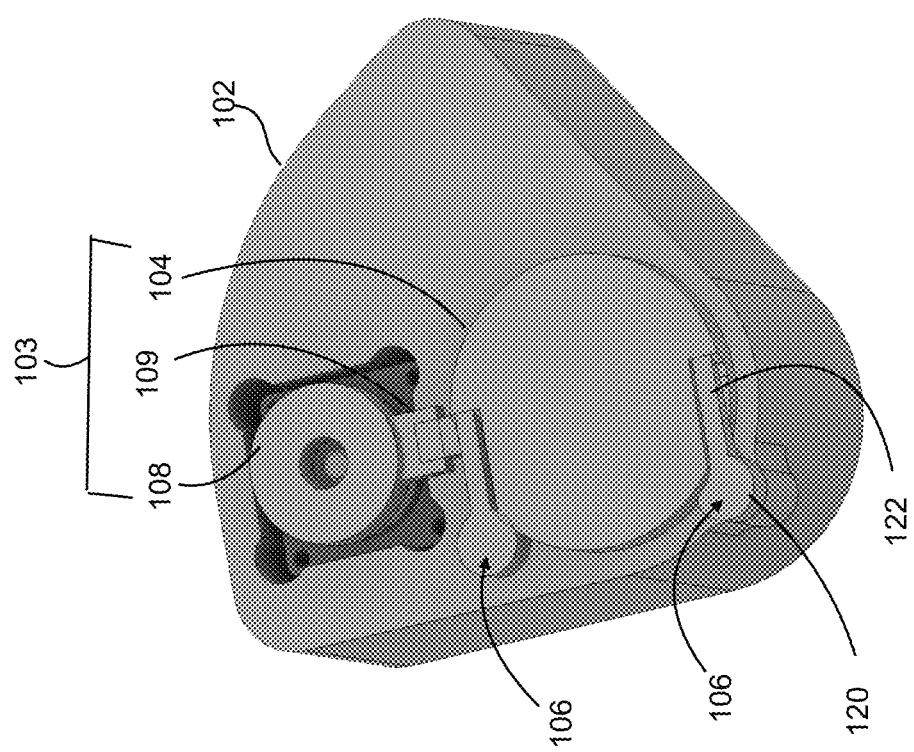
FIG. 7 shows a third top perspective view of the sample holder of FIG. 1.
Figure 8:
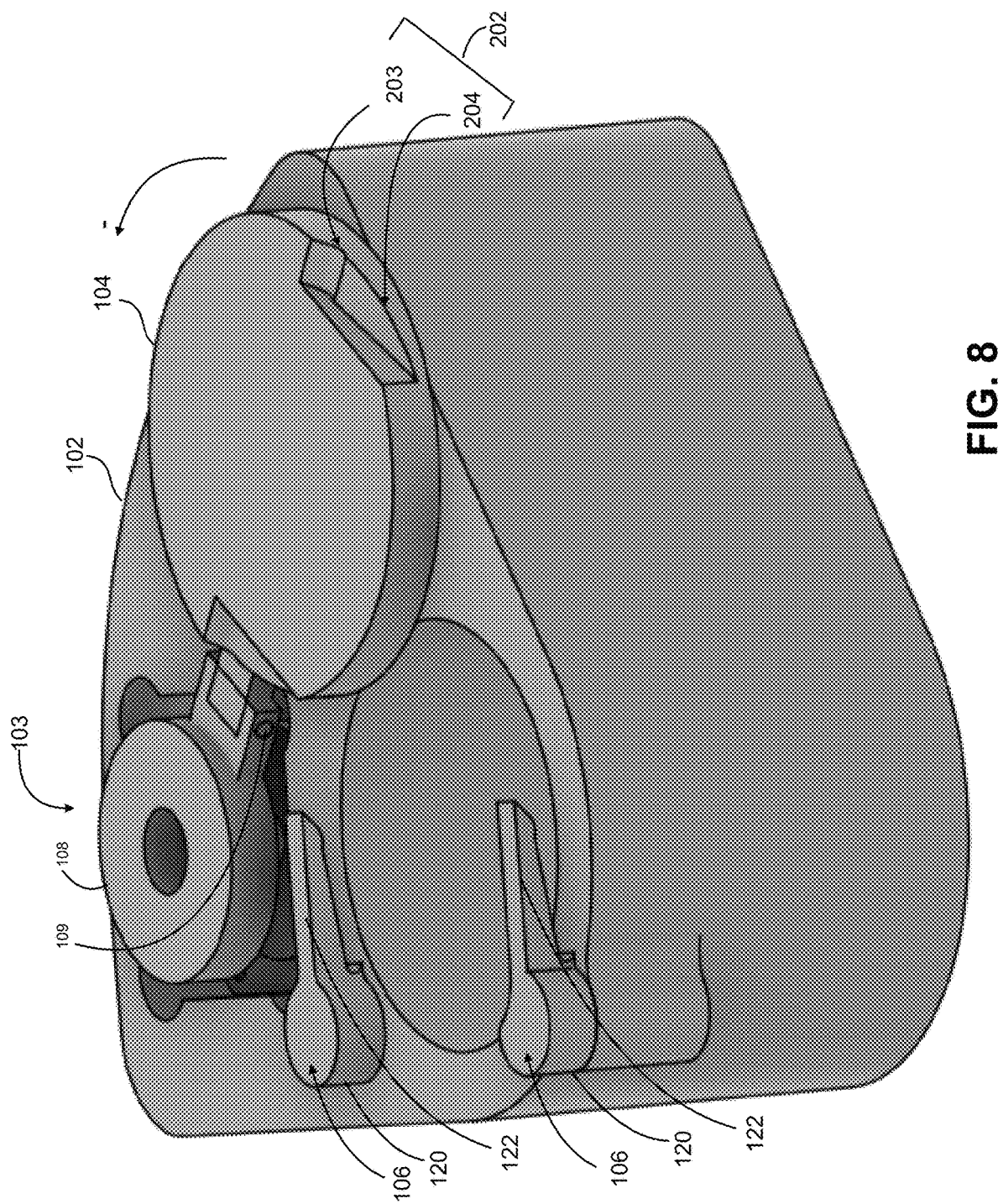
FIG. 8 shows a perspective view of the sample holder of FIG. 1 with the closure assembly in an open position.

The present description is related to sample holders for electron microscopy of air-sensitive samples, particularly for use in a focused ion beam scanning electron microscopy (FIB-SEM) system. A sample holder assembly, such as sample holder assembly at FIG. 1 includes a closure assembly, such as closure assembly shown in FIG. 2. The closure assembly includes a lid that has a top planar surface with a pair of closure arm receiving portions recessed from the top surface of the lid at opposite ends of the lid. Each of the pair of closure receiving portions include a ramp and a groove. The sample holder further includes a pair of closure arms, such as closure arms in FIG. 3, that are immovably coupled to the sample holder housing. In order to close the sample holder, a motor-based closure mechanism causes the lid to slide over the top surface of the sample holder such that the ramp and the groove of each of the closure arm receiving portion is pushed underneath each closure arm of the sample holder assembly. In a fully closed position, the ramp and groove receive corresponding complimentary surfaces of the closure arm. In this way, by wedging the lid under this arm, a downward pressure is generated as the arms are fixed and the downward pressure on the lid secured the lid above the sample stage. Further, the sample holder includes a motor assembly of opening and closing the lid, and an elevator assembly for moving the stage up and down about Z-axis of the microscope, as shown in FIGS. 4A, 4B, and 5. FIGS. 6, and 7 are different perspective views of the sample holder. FIG. 8 shows the sample in an open position. In this way, a sample holder for a dual beam FIB-SEM is provided with reduced interference with the microscope assembly during microscope operation.

Figure 1:
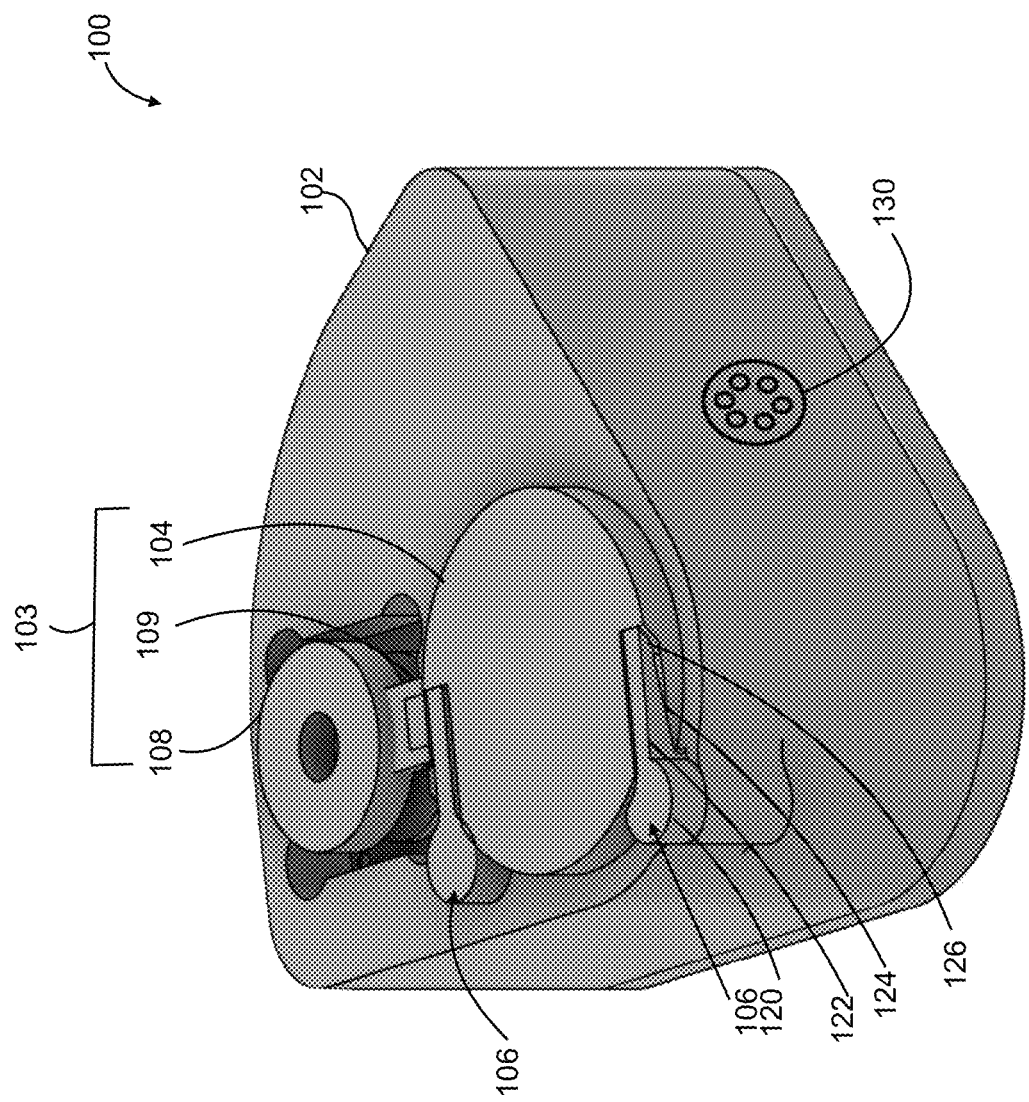
FIG. 1 shows a top perspective view of a sample holder according to the present invention.

Referring to FIG. 1, an air-free sample holder 100 (also referred to herein as sample holder) for mounting one or more samples for one or more of observation, analysis, and processing (e.g., fabrication of battery materials) using an electron microscope is shown. For example, sample holder 100 may be used in conjunction with one or more of a scanning electron microscope (SEM) or a Focused Ion Beam Scanning Electron Microscope (FIB-SEM). Sample holder 100 may be used for mounting and transporting air-sensitive samples from a vacuum or an inert environment of a glove box to a microscope stage of a microscope (such as SEM or FIB-SEM). Air-sensitive samples may include reactive materials such as lithium, that react (e.g., oxidize, explode, etc.) when exposed to air or moisture.

As shown, sample holder 100 includes an outer housing 102 that encloses a first motor assembly (not shown) and an elevator assembly (not shown). Sample holder 100 further includes a sample stage (not shown) for mounting one or more samples, which may be an air-sensitive material. Further, sample holder 100 includes a closure assembly 103 for enclosing the one or more samples mounted on the sample stage within an air-free chamber of sample holder 100. Sample holder 100 also includes a pair of closure arms 106 for securing and maintaining closure assembly 103 in a closed position, and sealing the air-free chamber during transport of sample holder 100 from the glove box to the microscope and vice-versa.

Figure 2:
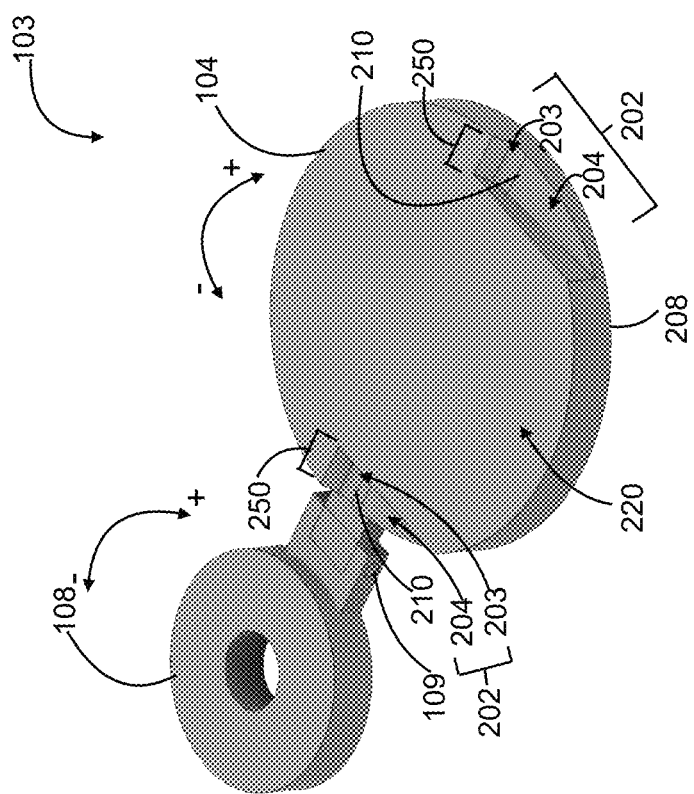
FIG. 2 shows a top perspective view of a closure assembly of the sample holder of FIG. 1.

Closure assembly 103 includes a lid 104 coupled to a motor cover plate 108 via a hinge 109. Close assembly 103 is further discussed with respect to FIG. 2. Turning now to FIG. 2, lid 104 includes a pair of closure arm receiving portions 202 (herein referred to alternatively as receiving portion 202). Further, herein, pair of closure arm receiving portions 202 may also be indicated as a first closure arm receiving portion and a second closure arm receiving portion. Each receiving portion 202 may be located at or near opposite ends of lid 104. In the example shown herein, lid 104 may be circular in shape, and as such, each receiving closure portion 202 is positioned at or near opposite ends of a diameter of lid 104. Examples wherein lid is configured in other geometric shapes, such as square, rectangular, etc., are also within the scope of the disclosure.

Each closure arm receiving portion 202 may be configured for receiving the corresponding closure arm 106 on housing 102 of sample holder 100, and securing lid with a downward pressure exerted by closure arms 106. Specifically, each receiving portion may include a ramp 204 and a groove 203 at a first end (higher level) of the ramp. Ramp 204 includes an inclined surface that begins at a horizontal edge 210 of groove 203 (higher level) and slopes downward toward a bottom edge 208 in a direction toward closure arm 106 and ends at a distance (lower level) from the bottom edge 208 of lid 104. Each groove 203 is configured as a downward convex bend with ramp 204 on one side and an inner wall cut out of lid 104 on an opposite side.

A width 250 of each receiving portion 202 may correspond to a second width of corresponding closure arm 106. In one example, receiving portion 202 may be formed by cutting out a portion on diametrically opposite ends of lid 204 to form a ramp and a groove.

In this way, lid 104 is configured with a pair of receiving portions 202, each including ramp 204 and groove 203, wherein each receiving portion 202 is located on diametrically opposite ends of the lid to receive corresponding closure arms 106 such that when the lid is in a closed position, closure arms 106 exert downward sealing pressure onto lid 104 to secure the lid onto the housing. Details of the closure arm are discussed with respect to FIG. 1.

Returning to FIG. 1, each closure arm 106 is shown immovably fixed to sample holder housing 102. Each closure arm 106 includes a base portion 120 coupled to housing 102 and an arm extension 122 extending toward lid 104 from the base. Arm extension 122 includes a bottom surface complimentary to ramp 204 and groove 203. Specifically, the bottom surface of each arm extension includes a diagonal surface 124 that slopes downward toward base 120 and a downward bulging convex surface 126. Thus, diagonal surface 124 is complimentary to ramp 204 and convex surface 126 is complimentary to groove 203. When the lid is in a fully closed position, diagonal surface 124 is in face-sharing contact with ramp 204 and convex surface 126 is in face-sharing contact with groove 203. As the lid is fixed to the housing 102 and therefore, immovable, when lid 104 is fully closed, closure arm 106 exerts a downward pressure onto the lid via the closure arm receiving portion 202, thus sealing the lid onto the sample holder. Specifically, lid 104 seals an opening within the housing that encloses the sample stage. Details of the sample stage will be described with respect to FIG. 3.

Figure 3:
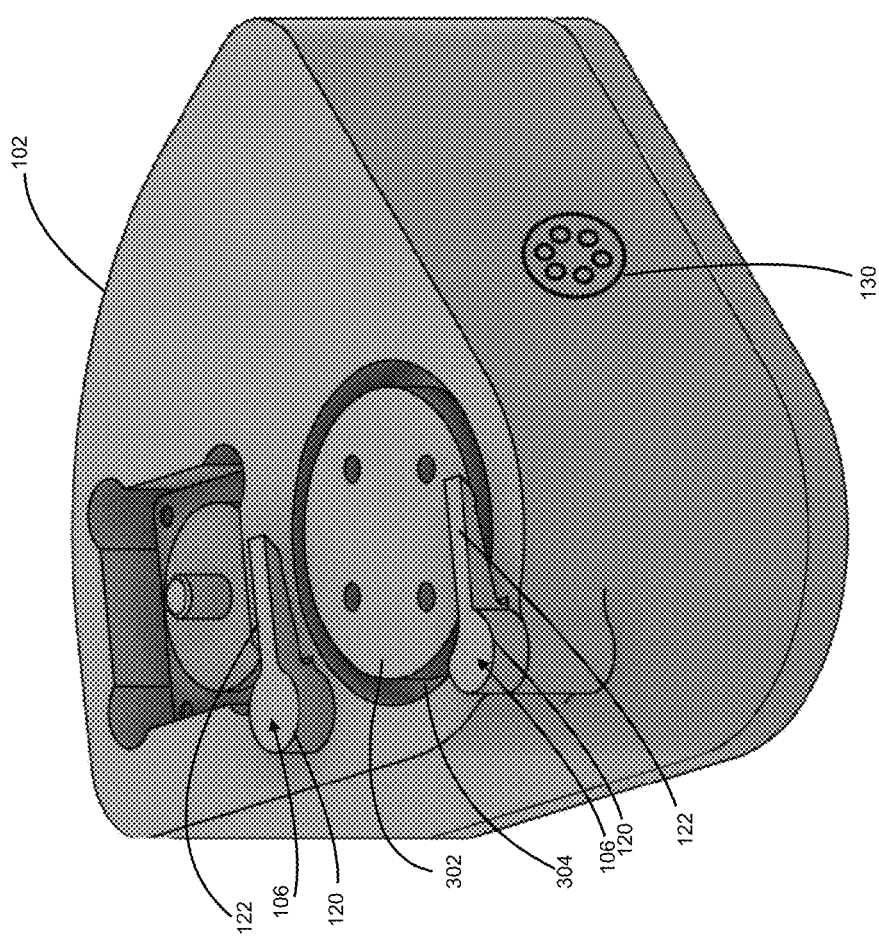
FIG. 3 shows a second top perspective view of the sample holder of FIG. 1 without the closure assembly.
Figure 4B:
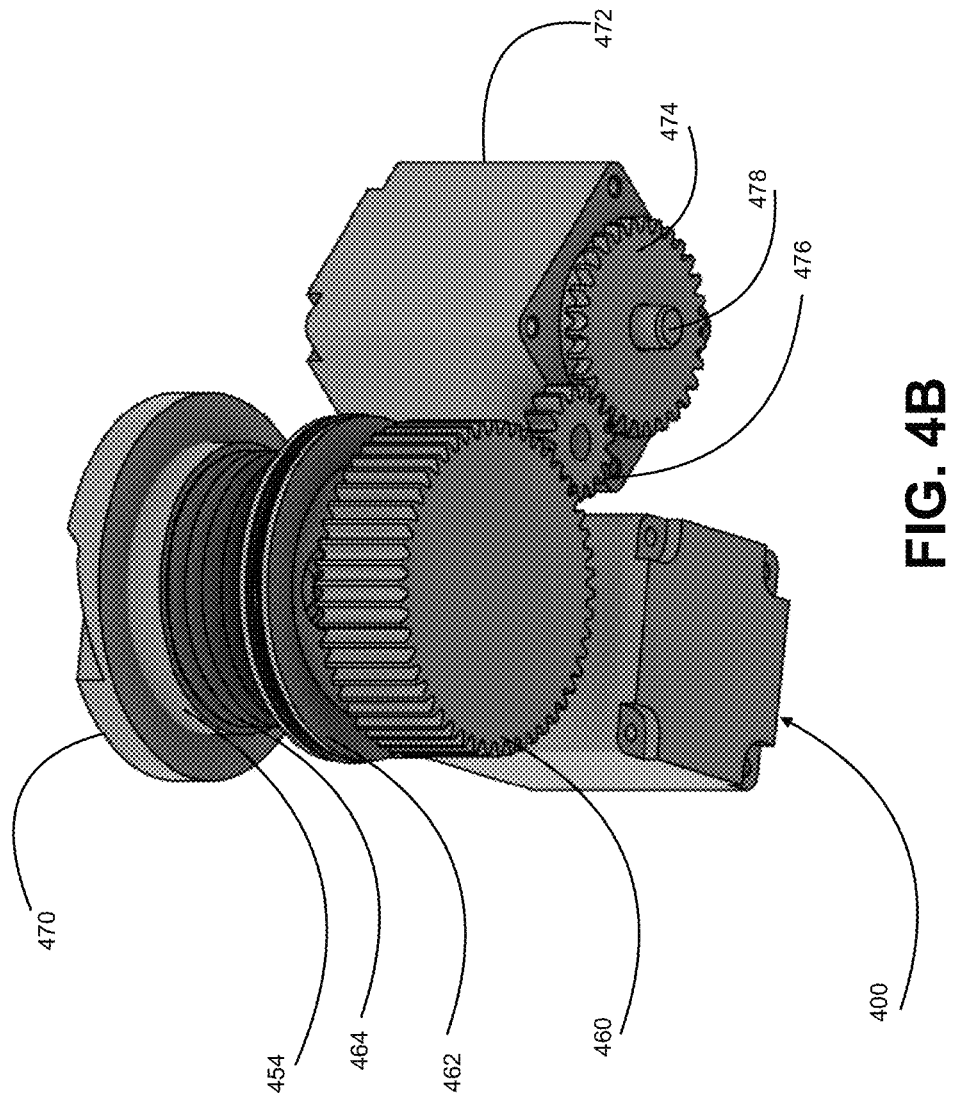
FIG. 4B shows a bottom perspective view of the first motor assembly and the elevator assembly of FIG. 4A.

Turning to FIG. 3, sample holder 100 is shown with closure assembly 103 removed for clarity purposes. Housing 102 includes a sample stage 302 for mounting one or more samples. Sample stage 302 may be positioned on top of an elevator assembly located within an opening 304 of housing enclosure 102. for raising and lowering the stage. Thus, sample stage 302 is shown located within an opening 304 of housing enclosure 102. Details of the elevator assembly will be described with respect to FIGS. 4A, 4B, and 5. When the sample holder is in a closed position, lid 104 rests on opening 304 and completely covers the opening 304. An O-ring may be provided within the opening 304 and/or lid for sealing purposes. In this way, when in a fully closed position, lid 104 completely covers opening 304 including sample stage 302. Further, each closure arm 106 is in direct contact with the complimentary closure arm receiving portion 202, and as each closure arm is immovable, it exerts downward pressure on the lid, thereby sealing the lid with the sample holder housing.

Specifically, when the sample is prepared and sealed in a glove box containing an inert atmosphere, an internal housing space between stage 302 and lid 104 (in the closed and sealed position), is filled with the inert gas of the glove box. Thus, an air-sensitive sample mounted on sample stage 302 is enclosed in an inert gas environment. The downward pressure exerted by the closure arms maintains the sealing during transport from the glove box to the microscope stage and vice-versa.

Returning to FIG. 2, closure assembly 103 further includes motor cover plate 108 that is coupled to a drive shaft of a first motor assembly. Cover plate 108 is joined with lid 104 via a hinge 109.

During an opening operation of lid 104, rotation of the first motor assembly causes cover plate 108 to rotate in an anti-clockwise direction (indicated as − in FIG. 2), which in turn results in a swing movement of closure assembly 103 in an anti-clockwise direction away from the sample stage. An illustration of sample holder 100 with the lid in a more open position (less closed) position is shown at FIG. 6.

During a closing operation of lid 104, rotation of the first motor is reversed, and as such, closure assembly 103 moves in a clockwise direction (indicated as + in FIG. 2), slides below closure arms 106 until an end of each closure arm rests in corresponding grooves 203.

Lid 104 includes a top surface 220 which is a flat planar surface with closure arm receiving portions 202 at diametrically opposite sides, wherein each closure arm receiving portion 202 is recessed from the top surface 220. Thus, lid 104 is configured so as to reduce hindrance caused by protrusions, such as screws, fasteners, etc on the lid. Specifically, previous approaches for sample holders include a screw-based mechanism including protruding knobs on a top surface of a sample holder lid. When closed, a user may utilize the knobs and screw-based mechanism to secure the lid onto the holder. By securing the lid with screws, previous sample holders apply downward pressure in order to seal the holder and prevent outside air from entering the holder. However, the inventor herein has identified that the screws and other protrusions, such as knobs, interfere with the operation of microscope. For example, in a FIB-SEM configuration, a tilt of the microscope stage is limited due to the protrusions on the lid. Further, the protrusions interfere with operations of probes and pole piece within the microscope. The above disadvantages of previous sample holders may be addressed by a lid for an air free sample holder, wherein a top surface of the lid is a planar flat surface without fasteners (such as screws, knobs, etc) protruding outwards from the sample holder lid in a direction away from the sample holder. The lid further includes a closure arm receiving portion on opposite sides of the lid, wherein each closure arm receiving portion is recessed from a top surface of the lid. Further, each closure arm receiving portion includes a groove and a ramp for receiving a corresponding closure arm configured with a complementary portion. The complimentary portion on each closure arm includes a bottom diagonal surface corresponding to the ramp, and a downward bulging portion corresponding to the groove. When the lid is in a closed position, the diagonal surface of the closure arm is in face-sharing contact with the ramp of the receiving portion and the downward bulging portion of the closure arm is in face-sharing contact with the groove of the receiving portion and rests within the groove. When the downward bulging portion of the closure arm is completely within the groove, the closure arm pushes the lid downward on to the sample holder (that is, in a direction toward gravity), which provides a desired downward pressure, perpendicular to the top surface of the lid, to seal the lid on to the sample holder.

In this way, the lid with a planar flat top surface and including the pair closure arm receiving portion on opposite sides of the lid, and the corresponding closure arms on the sample holder housing secure the lid on to the sample holder. When the sample holder is mounted onto the microscope stage, the planar flat top surface reduces interference of the sample holder with one or more components of the microscope. As a result, a microscope, such as a FIB-SEM microscope is able to achieve greater tilt of the sample stage and improved processing scope.

Further, motor cover plate 108 is coupled via hinge 109 to an exterior side wall of lid 104. In one example, as shown, the hinge joint is provided below a receiving portion 202. However, it will be appreciated that other locations of hinge that provide necessary rotation motion and flexibility at the joint to keep the lid flat (at all positions, including open and closed positions) are within the scope of the disclosure. Further, the location of hinge joint may be based on a shape on the lid.

In one example, as shown, a single hinge 109 is provided. The hinge allows a degree of freedom of movement about the hinge that allows the hinge to maintain a flat position over the opening and stage. As a result, the sealing between the lid and the sample holder is maintained.

In another example, a double hinge mechanism may be used so that the lid has additional degree of freedom that assists the lid to stay flat over the stage and opening.

In yet another example, the motor adapter may be mounted on the shaft that contains a spline and allows up and down motion of the motor adapter. This will enable the whole assembly (motor adapter and the lid) to remain flat over the stage and opening.

Turning to FIGS. 4A and 4B, a first motor assembly 400 for adjusting operation of a sample holder lid, such as lid 104 at FIG. 1, and an elevator assembly 450 for raising and lowering a sample stage, such as sample stage 302 at FIG. 3, are shown. FIG. 5 shows an exploded view of first motor assembly 400 and elevator assembly 450. As such, the following description is provided with respect to FIGS. 4A, 4B, and 5. First motor assembly 400 and elevator assembly 450 may be enclosed within a housing, such as housing 102 of sample holder 100 at FIG. 1.

First motor assembly 400 includes a drive shaft 402 that may be coupled to a motor cover plate, such as motor cover plate 108 at FIGS. 1 and 2. Operation of first motor assembly 400 may be adjusted via an external controller communicably coupled to the motor via connector 130 on the housing; the connector 130 may comprise a serial connection, general purpose I/O headers, or other data interface. As discussed above, during an opening operation of the sample holder, operation of motor assembly may be adjusted to move the lid away from sample stage 454 in an anti-clockwise direction. During a closing operation of the sample holder, motor assembly 400 may be adjusted to move the lid towards sample stage 454 in a clockwise direction. The connectors 130 may also comprise additional facilities for connecting other devices, such as heating elements, electrical biasing circuits, thermocouples, and other facilities typically used in in situ experiments.

Elevator assembly 450 includes a second motor 472 and a bellows assembly 456. Bellows assembly 456 may include a bellows gear 460 coupled via shaft (not shown) to a flange and O-ring assembly 462. Edge welded bellows 464 are coupled to the flange and O-ring assembly on an underside of bellows 464. Sample stage 454 is positioned on a top surface of bellows 464 and coupled to bellows 464. FIG. 4B shows a lid 470 positioned above sample stage 454. Sample stage 454 includes one or more stud slots for loading a sample onto the stage. Lid 470 may not be in face-sharing contact with the sample stage, and thus, when the lid is fully closed, inert gas is trapped in an air-free chamber between sample stage and lid.

Elevator assembly 450 further includes a second drive shaft 478 coupled to second motor 472. A motor gear 474 is shown coupled to second drive shaft 478 and to coupling gear 476. Elevator assembly 450 and second motor 472 are coupled via coupling gear 476. Motor gear 474, coupling gear 476, and bellows gear 460 translate a rotation motion of drive shaft to a vertical (upward movement away from gravity and downward movement toward gravity) movement of flange and O-ring assembly 462, bellows 464, and stage 454.

As discussed above, housing 102 may include a cylindrical opening, such as opening 304 at FIG. 3, within which bellows assembly 456 may be positioned. Thus, a radius of the opening may be greater than a radius of bellows assembly. Operation of elevator assembly may be adjusted through an adjustment of second motor 474 via an external controller coupled to the second motor 474.

Elevator assembly 450 may provide an upward and downward movement of stage 454. For example, when the sample holder is positioned on to a microscope stage, elevator assembly 450 may be used to adjust a position of the sample stage 454. This provides fine-tune control of sample stage 454 along a z-axis of the microscope. In this way, a built-in Z-height adjustment is provided within the air-free sample holder.

Note that the example sample holder included herein can be used with various scanning electron microscope configurations, such as SEM and FIB-SEM. Additionally, it can be used in various instruments related to imaging and spectroscopy that include a vacuum chamber that is large enough to include such a sample holder such as X-ray photoelectron spectrometer (XPS) and nano-Auger (which combines an SEM with Auger spectroscopy).

It will be appreciated that the configurations disclosed herein are exemplary in nature, and that these specific embodiments are not to be considered in a limiting sense, because numerous variations are possible. For example, the above technology can be applied to several microscopy and spectroscopy techniques involving instruments such as transmission electron microscopy (TEM), scanning transmission electron microscope (STEM), scanning electron microscope (SEM) and also microscopes or spectroscopes outside the field of electron microscopy, for example instruments that use X-ray, visible light and infra-red light and ultraviolet light for imaging and spectroscopy. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A sample holder for focused ion beam scanning electron microscopy, comprising:
   a housing;
   a closure assembly coupled to the housing, comprising:
      a lid comprising one or more closure arm receiving portions and a flat, planar upper surface,
         wherein the one or more closure arm receiving portions are recessed from the upper surface
         wherein each of the one or more closure arm receiving portions comprise a ramp and a groove;
      one or more closure arms corresponding to the one or more closure arm receiving portions, each closure arm comprising a diagonal surface complimentary to the corresponding ramp and a downward surface complimentary to the groove;
         wherein when the lid is in a fully closed position, the diagonal surface(s) is/are in face-sharing contact with the ramp(s) and the downward surface(s) is/are in face-sharing contact with the groove,
         wherein the lid is flexibly coupled to a motor cover plate configured to receive a drive shaft of a first motor assembly;
   an elevator assembly, comprising:
      a sample stage,
      a bellows assembly comprising:
         a bellows coupled to the underside of the sample stage and a flange;
         a bellows gear coupled to the flange via a driveshaft; and
         a second motor assembly configured to rotate the bellows gear via a coupling gear.

* * * * *